(12) United States Patent
Ibok (10) Patent No.: US 6,391,784 B1
(45) Date of Patent: May 21, 2002

(54) SPACER-ASSISTED ULTRANARROW SHALLOW TRENCH ISOLATION FORMATION

(75) Inventor: Effiong E. Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,969

(22) Filed: Jul. 21, 1999

(51) Int. Cl.[7] .............................................. H01L 21/302
(52) U.S. Cl. ...................... 438/702; 438/424; 438/430; 438/431; 438/432; 438/404
(58) Field of Search .................. 438/424, 430, 438/432, 435, 404, 438, 702

(56) References Cited

U.S. PATENT DOCUMENTS

| | | | | |
|---|---|---|---|---|
| 5,904,540 A | * | 5/1999 | Sheng et al. ................. | 438/427 |
| 5,976,951 A | * | 11/1999 | Huang et al. ................. | 438/435 |
| 6,051,478 A | * | 4/2000 | Ibok ............................ | 438/424 |
| 6,074,927 A | * | 6/2000 | Kepler et al. ................ | 438/400 |
| 6,110,800 A | * | 8/2000 | Chou ........................... | 438/431 |
| 6,153,480 A | * | 11/2000 | Arghavani et al. .......... | 438/296 |
| 6,165,854 A | * | 12/2000 | Wu .............................. | 438/296 |
| 6,194,283 B1 | * | 2/2001 | Gardner et al. ............. | 438/424 |

* cited by examiner

*Primary Examiner*—George Goudreau (57) ABSTRACT

An ultranarrow insulated trench isolation structure is formed in a semiconductor substrate without creating voids in the insulating material which adversely affect the performance of finished devices. Embodiments include forming a narrow trench in the semiconductor substrate, then forming a spacer on the sidewalls of the trench, as by depositing and anisotropically etching a layer of silicon dioxide, amorphous silicon, or silicon oxynitride. The trench is then refilled as by conventional LPCVD, PECVD or HDP techniques, and the spacers are oxidized, if necessary. Since the spacers, in effect, create sloped trench walls, the trench fill can be performed, even at a high deposition rate, with substantially fewer voids than conventional processes, while also reducing reentrance of the trench walls.

11 Claims, 6 Drawing Sheets

SPACER-ASSISTED ULTRANARROW SHALLOW TRENCH ISOLATION FORMATION

FIELD OF THE INVENTION

The present invention relates to a method of manufacturing a semiconductor device comprising trench isolation. The invention has particular applicability in manufacturing high-density semiconductor devices with submicron design features and active regions isolated by narrow shallow insulated trenches.

BACKGROUND ART

Conventional semiconductor devices comprise a substrate and various electrically isolated regions, called active regions, in which individual circuit components are formed. The active regions typically comprise source/drain regions formed in the semiconductor substrate by implantation of impurities, spaced apart by a channel region on which a gate electrode is formed with a gate oxide layer therebetween. The gate electrode controls the turn-on and turn-off of each transistor.

The electrical isolation of these active regions is typically accomplished by thermal oxidation of the semiconductor substrate, typically monocrystalline silicon or an epitaxial layer formed thereon, bounding the active regions. One type of isolation structure is known as trench isolation, wherein shallow trenches are etched in the substrate, and an oxide liner is thermally grown on the trench walls. The trench is then refilled with an insulating material. The resulting structure is referred to as a shallow trench isolation (STI) structure.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the corners, walls and base of the trench to control the silicon-silicon dioxide interface quality and to round the trench edges where they meet the substrate main surface to improve subsequent gate oxide growth. The trench is then refilled with an insulating material (or "trench fill"), such as silicon dioxide derived from tetraethyl orthosilicate (TEOS) deposited by low pressure chemical vapor deposition (LPCVD) or plasma enhanced chemical vapor deposition (PECVD), or a high density plasma (HDP) oxide. The surface is then planarized, as by chemical-mechanical polishing (CMP) using the barrier nitride layer as a polish stop, and the nitride and pad oxide are stripped off the active areas to complete the trench isolation structure.

Current demands for high density and performance associated with ultra large scale integration require submicron features of about 0.25 microns ($\mu$m) and under, including ultranarrow STI trenches having widths of about 0.25 $\mu$m or less and depths of up to 0.4 $\mu$m. However, at such small trench widths, voids (i.e., seams) occur in the trench fill, adversely affecting the electrical characteristics of the finished devices. It is believed that voids occur due to the fact that these ultranarrow trenches tend to have vertical walls.

Prior attempts to reduce voids comprise lowering the oxide deposition rate, but this technique disadvantageously reduces production throughput by increasing the amount of time needed for the trench fill step. For example, oxide trench fill can be accomplished using high deposition rate technology such as PECVD and HDP, without voids, when the trench width is above about 0.4 $\mu$m. However, at trench widths of about 0.35 $\mu$m and below, PECVD techniques do not yield acceptable results (i.e., they form too many voids). Thus, for ultranarrow trenches, only a low deposition rate trench fill process such as LPCVD can be successfully employed. In addition to its low deposition rate, LPCVD methodology further reduces production throughput since it requires frequent maintenance. Moreover, at trench widths below about 0.3 $\mu$m, all deposition processes produce voids in the trench fill of moderately deep trenches (i.e., trenches having a depth of about 0.4 $\mu$m).

A further problem in STI formation is stress induced at the top corners (i.e. edges) of the trench and at the sidewalls of the trench when the trench is brought up to temperature (typically about 1000° C.) for the liner oxidation/edge-rounding step. This stress is transmitted to the active regions of the substrate, resulting in degradation of the quality of the gate oxide, which adversely affects the performance of the finished device. Stress transmitted to the active areas during STI formation becomes more severe as the width of active areas decreases; e.g., to below about 0.3 $\mu$m.

The stress at the top corners of the trench is believed to be due to the high temperatures necessary for oxidation. The stress at the trench walls is believed due to a phenomenon known as "reentrance" of the walls. Trench walls are conventionally formed having a preferred slope, e.g., about 70 to 75 degrees from the horizontal. However, during the oxidation step, the walls expand inwardly and tend to vertically align due to excessive oxidation of the trench wall relative to the adjacent active region, thereby inducing stress in the active region. This condition is called reentrance. The excessive oxidation occurs because the oxide grows faster on the trench walls than on the surface of the substrate, which has a different crystallographic orientation. Reentrance becomes more severe as the width of the trench is decreased below about 0.30 $\mu$m, because ultranarrow trenches tend to have more vertical walls due to the difficulty in forming such trenches with the above-discussed preferred slope.

There exists a need for a method of manufacturing a semiconductor device having an STI structure with ultranarrow trenches without voids in the trench fill, which STI structure can be produced using a high deposition rate trench fill technique, thereby improving device performance and increasing production throughput. There also exists a continuing need for shallow trench isolation methodology that eliminates or significantly reduces stress and reentrance of the trench surface resulting from the oxidation step, thereby reducing stress in the active regions of the substrate and, hence, improving gate oxide quality.

SUMMARY OF THE INVENTION

An advantage of the present invention is a method of manufacturing a semiconductor device having insulated narrow trenches formed in a semiconductor substrate with substantially no voids in the insulating trench fill, using a high deposition rate process. A further advantage of the present invention is a method of manufacturing a semiconductor device having STI with reduced stress in the active regions of the substrate.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a narrow trench in a semiconductor substrate, the trench having an internal surface and having edges at a main surface of the substrate; depositing a spacer formation layer to cover the internal surface of the trench; anisotropically etching the spacer formation layer to form thin spacers on sidewalls of the internal surface of the trench; and depositing an insulating material to fill the trench substantially without creating voids.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for manufacturing semiconductor devices with narrow isolation trenches result in voids in the trench fill insulating material and stress in the active regions adjacent to the narrow trenches, thereby adversely affecting the performance of the finished devices. Such conventional methodologies also require the use of slow and maintenance-intensive trench filling techniques, thus increasing manufacturing costs and reducing production throughput. The present invention addresses and solves problems stemming from these conventional techniques.

According to the methodology of the present invention, a narrow trench is formed in a semiconductor substrate and an edge-rounding oxide liner is grown in a conventional manner. As used throughout the present disclosure and claims, the term "substrate" denotes a semiconductor substrate or an epitaxial layer formed on the semiconductor substrate. A spacer is then formed on the sidewalls of the trench, as by depositing and anisotropically etching a layer of silicon dioxide. The trench is then refilled as by conventional LPCVD, PECVD or HDP techniques. Since the spacers, in effect, create sloped trench walls, the trench fill can be performed, even at a high deposition rate, with substantially fewer voids than conventional processes. Reentrance is also reduced due to the slope of the trench walls.

In other embodiments of the present invention, a thin nitrogen-rich oxide layer is formed directly on the sidewalls of the trench, as by rapid thermal annealing (RTA) in a nitric oxide or ammonia atmosphere, and the spacers are then formed from a layer of amorphous or polycrystalline silicon. The spacers are thereafter oxidized, as by thermal oxidation, thereby rounding the trench corners and converting the polysilicon or amorphous silicon to an insulating oxide. The trench is filled either before or after the oxidation step. In filling the trench, conventional trench-fill techniques can be employed. The slope of the spacers reduces the formation of voids in the trench fill, and the nitrogen in the oxide layer on the trench walls reduces reentrance during the oxidation step by reducing the oxidation rate of the trench walls. In other words, the nitrogen reduces oxidation into the trench walls, so they do not become more vertical. Instead, the slope of the spacers increases during oxidation. This further reduces the occurrence of voids if the trench is filled after oxidation of the spacers, and tends to fill voids if the oxidation is performed after the trench filling step.

In further embodiments of the present invention, the spacers are formed from a layer of silicon oxynitride, then oxidized prior to refilling the trench. Due to the presence of nitrogen in the spacers, a separate nitrogen-containing layer is not necessary to prevent reentrance in this embodiment.

An embodiment of the present invention is illustrated in FIGS. 1A–1G, wherein sequential phases in forming a semiconductor device in accordance with the present invention are depicted.

Figure 1A:
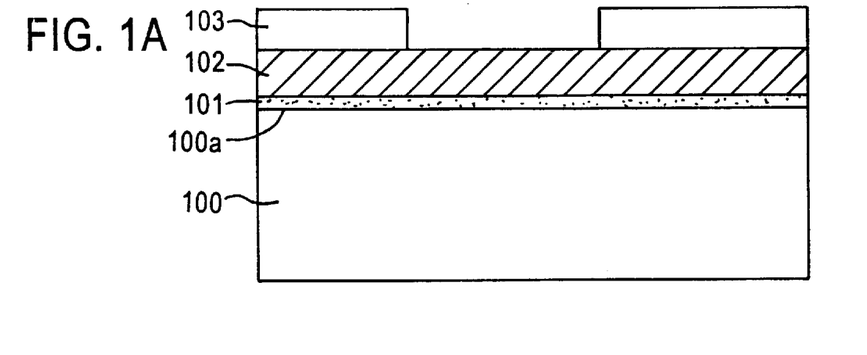
FIGS. 1A–1G schematically illustrate sequential phases of a method in accordance with an embodiment of the present invention.

Referring to FIG. 1A, substrate 100 is prepared having a substantially planar main surface 100a, typically a semiconductor substrate comprising doped monocrystalline silicon or an epitaxial layer formed on a semiconductor substrate in accordance with conventional practices. A pad oxide layer 101 is then grown on the substrate 100. Pad oxide layer 101 is typically silicon oxide and can be thermally grown on the substrate or deposited by chemical vapor deposition (CVD) to a thickness of about 100 Å to about 200 Å. In another embodiment, a pad oxide containing a thinned thermally-grown silicon oxide layer and a buffer polycrystalline silicon layer is employed as the pad layer.

After formation of pad oxide layer 101, a barrier nitride layer 102 is deposited on the pad oxide layer 101, such as a silicon nitride layer by CVD. Pad oxide 101 functions as a buffer layer cushioning stresses between substrate 100 and barrier nitride layer 102. Barrier nitride layer 102 functions as an oxidation mask as it is resistant to the diffusion of oxygen and water vapor therethrough, thereby preventing an oxidizing species from reaching the underlying silicon substrate, and also acts as a polish stop.

Figure 1B:
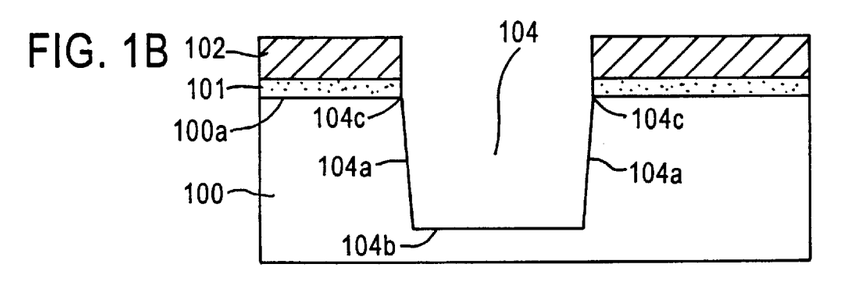

A photoresist mask 103 is then formed on barrier nitride layer 102, and barrier nitride layer 102 is then etched away. The etching continues through pad oxide layer 101 and into substrate 100 to form an ultranarrow trench 104 having internal sidewalls 104a, a bottom 104b and edges 104c, as shown in FIG. 1B. The trench 104 has a width of less than about 0.2 μm, and is typically etched to a depth of about 2500 Å to about 4000 Å. When the etching of the trench 45 is completed, the photoresist 103 is stripped off the barrier nitride layer 102, resulting in the trench shown in FIG. 1B.

Figure 1C:
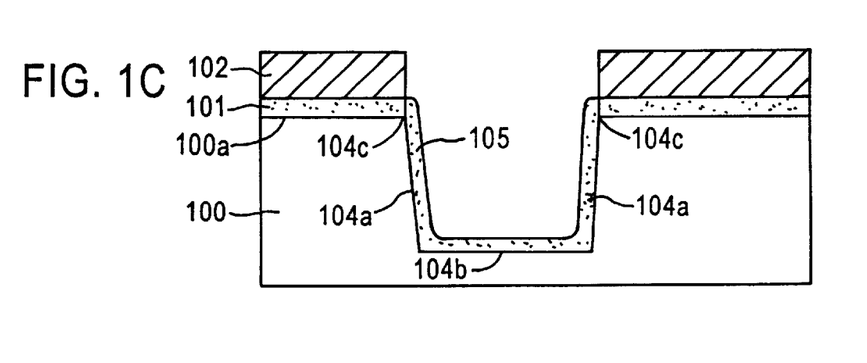
Figure 1D:
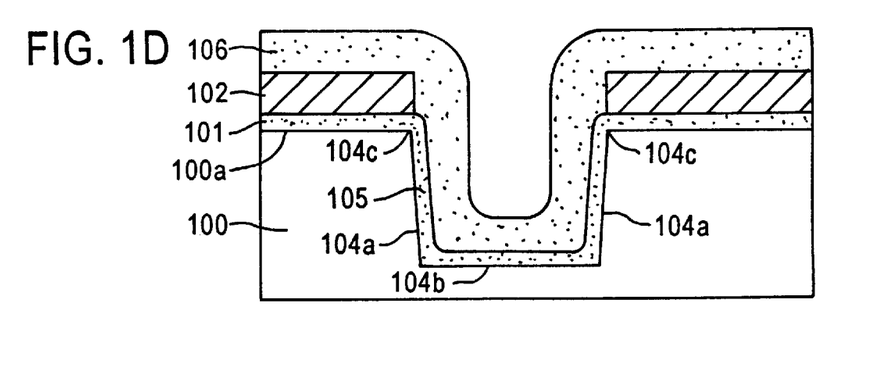
Figure 1E:
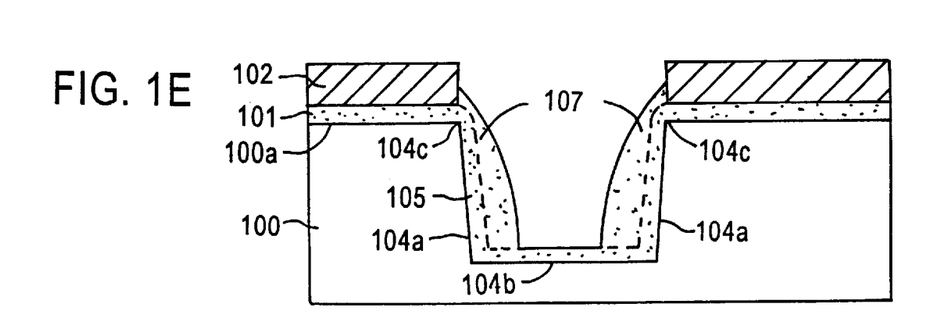

Thereafter, trench inner surface 104a, 104b is thermally oxidized to form a silicon dioxide liner 105 on the internal surfaces 104a, 104b and edges 104c, typically at a temperature of about 1000° C. or higher. FIG. 1C shows trench 104 with the completed oxide liner 105, which serves to round edges 104 to ensure the quality of the subsequently formed gate oxide. Subsequent to formation of oxide liner 105, a layer of silicon dioxide 106 is deposited in trench 104, as by CVD, to a thickness of about 600 Å on trench bottom 104b (see FIG. 1D). Next, as shown in FIG. 1E, silicon dioxide layer 106 is anisotropically etched to form spacers 107 on sidewalls 104a. Due to the nature of the anisotropic etching process, the outer walls of spacers 107 have a greater slope than sidewalls 104a.

Figure 1F:
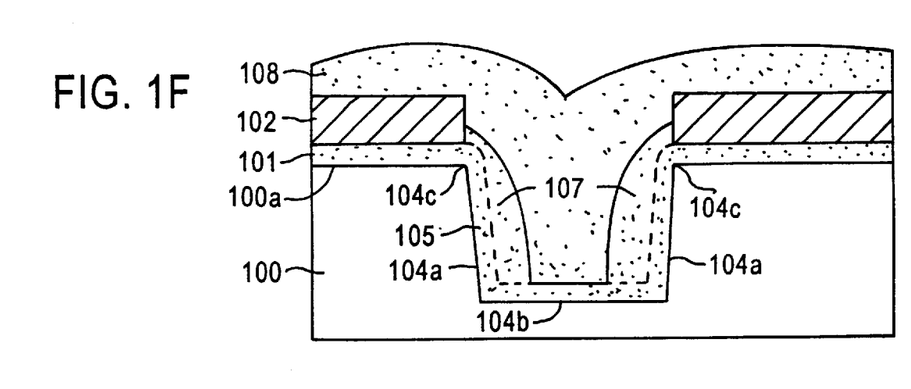

Thereafter, trench 104 is filled with a suitable insulating material 108, as shown in FIG. 1F. Such insulating material can comprise silicon dioxide derived from TEOS by LPCVD or PECVD, or silicon dioxide derived from silane by LPCVD. The trench 104 can also be filled with a high density plasma (HDP) oxide, preferably employing the methodology disclosed in copending application Ser. No. 08/924,133, filed Sep. 5, 1997, now U.S. Pat. No. 6,046,106 the entire disclosure of which is hereby incorporated herein by reference. Since spacers 107 provide sloped trench walls, the trench fill process is performed, even at a high deposition rate, substantially without voids. Reentrance and consequent stress in adjoining active areas is also reduced due to the slope of the trench walls.

Figure 1G:
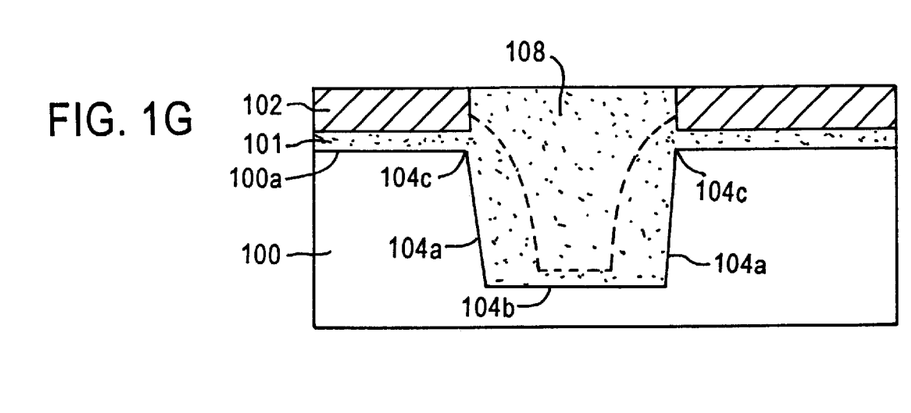

Subsequent to trench filling, planarization is effected, such as by CMP, as shown in FIG. 1G. The barrier nitride layer 102 and the pad oxide layer 101 are thereafter stripped off to complete the STI structure.

Figure 2A:
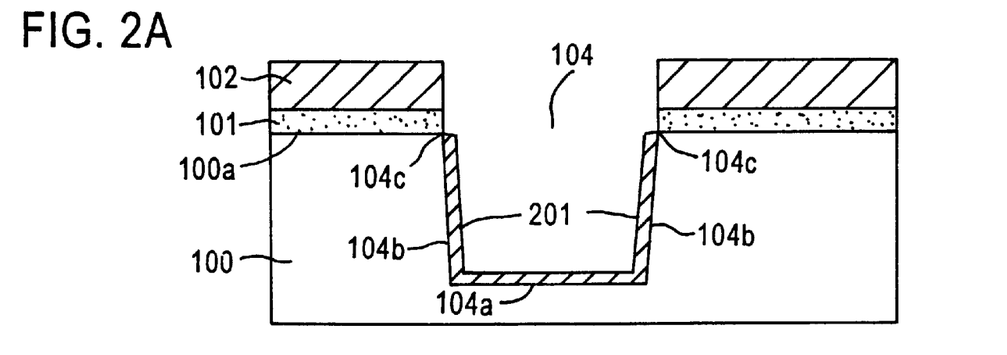
FIGS. 2A–2F schematically illustrate sequential phases of a method in accordance with a further embodiment of the present invention.

In another embodiment of the present invention, sequential phases of which are depicted in FIGS. 2A–2F, internal surfaces 104a, 104b of trench 104 are nitridized, spacers are formed from a polysilicon or amorphous silicon layer, and the spacers are then oxidized. As shown in FIG. 2A, after trench 104 is formed as described above with reference to FIG. 1B, a silicon nitride layer 201 is formed on trench sidewalls 104a and bottom 104b, as by rapid thermal annealing (RTA) in an atmosphere of nitrous oxide or ammonia, to a thickness of about 30 Å.

Figure 2B:
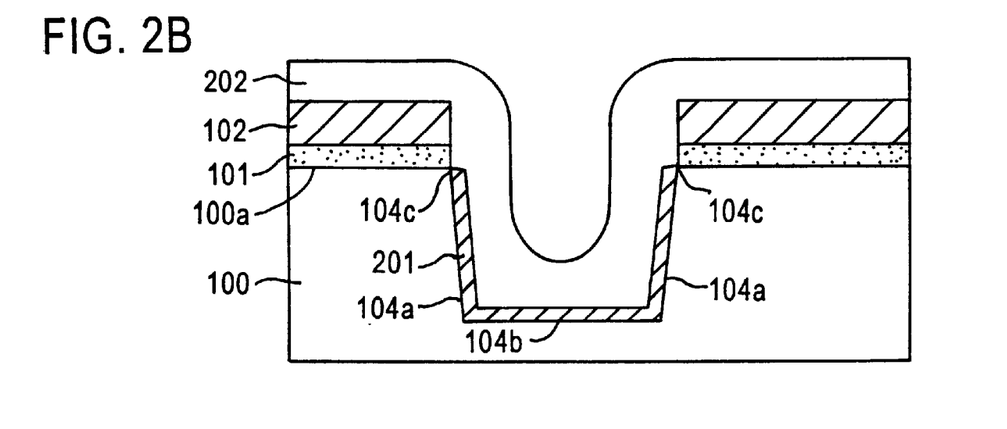
Figure 2C:
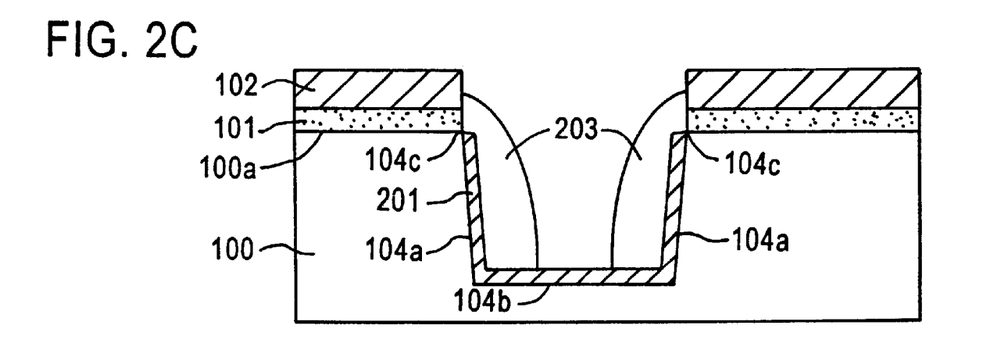
Figure 2D:
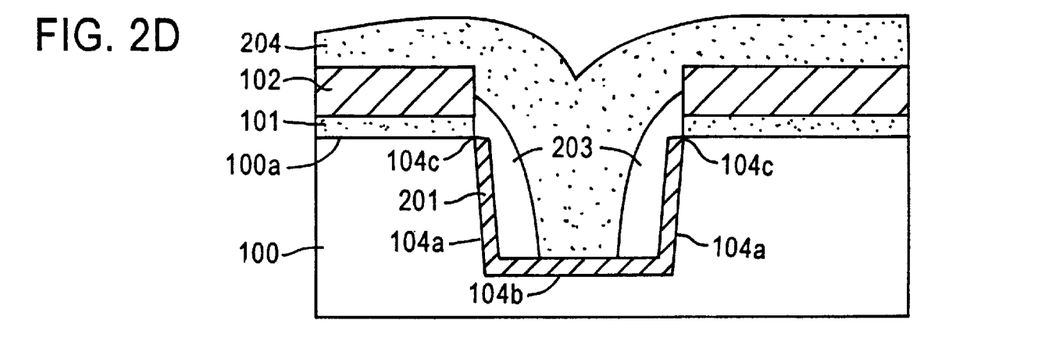
Figure 2E:
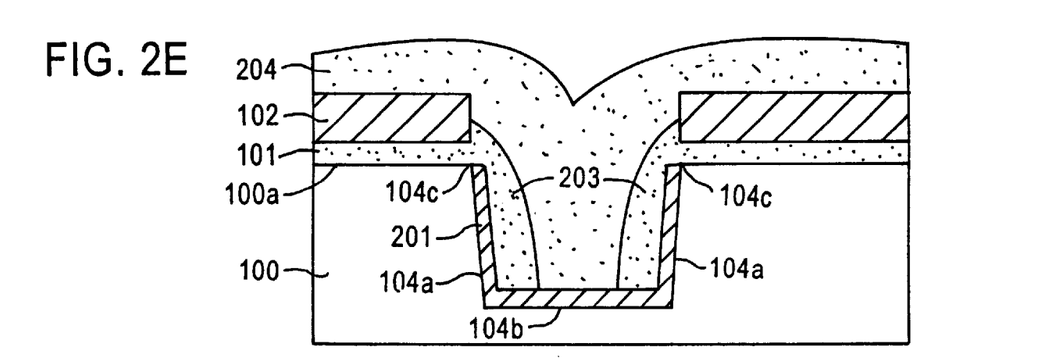
Figure 2F:
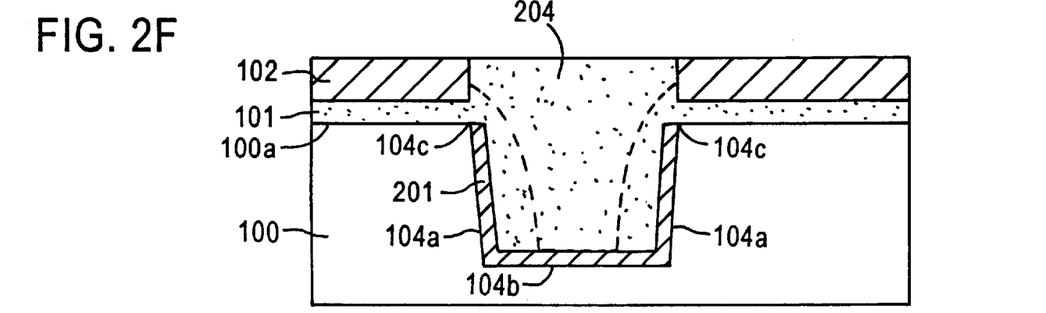

Next, referring to FIG. 2B, a silicon layer 202 comprising amorphous silicon or polysilicon is deposited in trench 104 and on main surface 100a, as by CVD, to a thickness of about 200 Å to about 300 Å. Amorphous silicon is preferred as the material for silicon layer 202, because it results in a smoother surface. Silicon layer 202 is then anisotropically etched to form spacers 203 (see FIG. 2C). Trench 104 is then refilled as shown in FIG. 2D with an insulating material 204 as described above with reference to FIG. 1F. Thereafter, spacers 203 are substantially completely oxidized, as by heating to a temperature of about 1000° C. in a steam or dry environment (see FIG. 2E), and insulating material 204 is planarized, as shown in FIG. 2F.

As in the embodiment of FIGS. 1A–1G, spacers 203 effectively increase the slope of sidewalls 104a, enabling trench 104 to be filled substantially without voids. Due to the presence of nitrogen from nitride layer 201 in trench sidewalls 104a, which reduces the oxidation rate of sidewalls 104a, spacers 203 do not oxidize into sidewalls 104a during the spacer oxidation step, thereby preventing over-oxidation of the trench surface and reentrance of sidewalls 104a. Furthermore, by oxidizing spacers 203 after the deposition of insulating material 204, any voids in insulating material 204 are filled. Still further, because silicon 202 covers trench edges 104c, when silicon 202 is oxidized, edges 104c are rounded without the need to form a separate liner, such as oxide liner 105 in the embodiment of FIGS. 1A–1G.

In an alternative embodiment of the present invention, spacers 203 are oxidized prior to filling trench 104 with insulating material 204; i.e., after the anisotropic etching step described with reference to FIG. 2C. In this case, the slope of spacers 203 increases during the oxidation step, because the volume of spacers 203 increases during oxidation, thus further decreasing the chance of the formation of voids during the subsequent trench filling step. However, due to the nitrogen in nitride layer 201, no reentrance of sidewalls 104a occurs during oxidation; that is, spacers 203 expand inwards towards the center of trench 104.

In a further alternative embodiment of the present invention, spacers 203 are not oxidized until after the planarization step shown in FIG. 2D. This technique results in more effective rounding of edges 104c vis-a-vis the previously described embodiments of the present invention. Furthermore, the nitridizing step described above with reference to FIG. 2A is not needed, because oxidation is completed in a shorter amount of time than in the previously-described embodiments and, as a result, reentrance during oxidation is minimal.

Figure 3A:
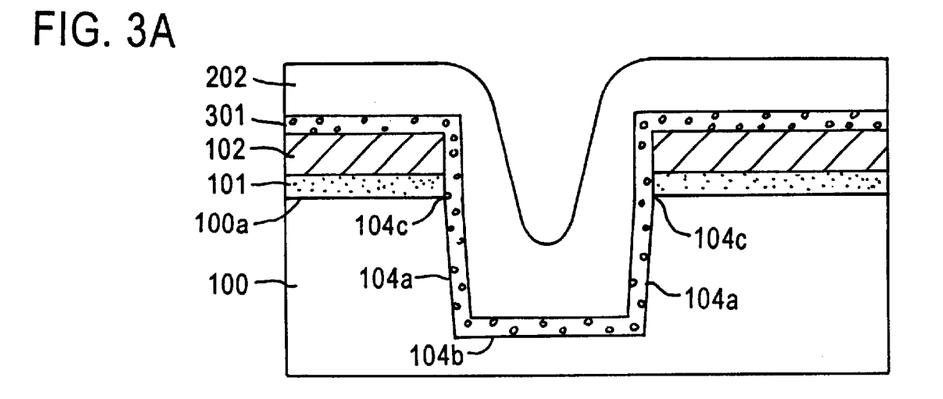
FIGS. 3A–3C schematically illustrate sequential phases of a method in accordance with a further embodiment of the present invention.
Figure 3B:
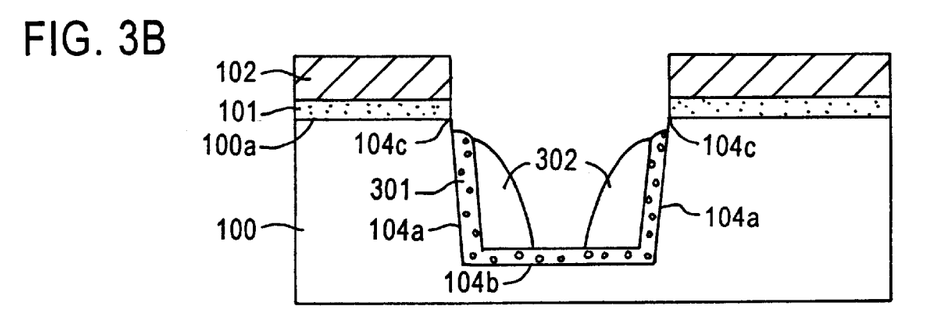
Figure 3C:
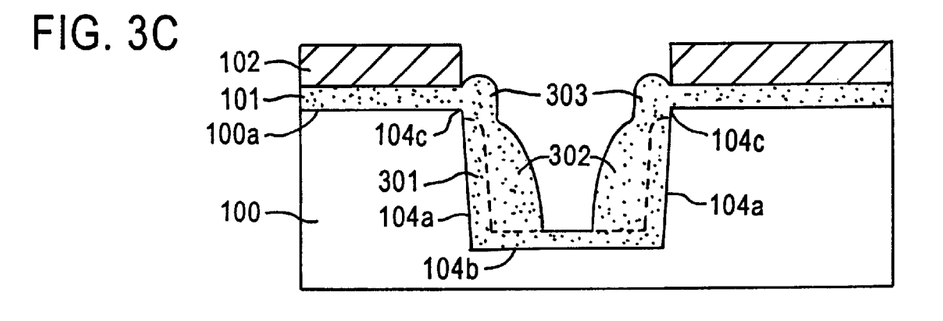

In another alternative embodiment of the present invention, as shown in FIGS. 3A–3C, instead of nitride layer 201, a thin silicon oxynitride layer 301 is deposited after trench formation, as by CVD, to a thickness of about 50 Å or less, and silicon layer 202 is deposited as described above (see FIG. 3A). Silicon layer 202 and silicon oxynitride layer 301 are then both anisotropically etched such that edges 104c are exposed (see FIG. 3B) and spacers 302 are formed. A thermal oxidation step is then performed as described above to oxidize silicon oxynitride layer 301 and spacers 302, and to round edges 104c by growing a rounded silicon dioxide layer 303 on edges 104a to a thickness of about 300 Å or greater (see FIG. 3C). Trench 104 is then refilled and planarized as previously described. Trench sidewalls 104a are not over-oxidized, due to the nitrogen in silicon oxynitride layer 301, thereby avoiding reentrance of sidewalls 104a. Furthermore, because nitrogen from silicon oxynitride layer 301 bonds with the silicon of sidewalls 104a, "fixing" the silicon atoms so they do not move freely, stress in sidewalls 104a is not freely transmitted to active areas adjacent to sidewalls 104a.

Figure 4A:
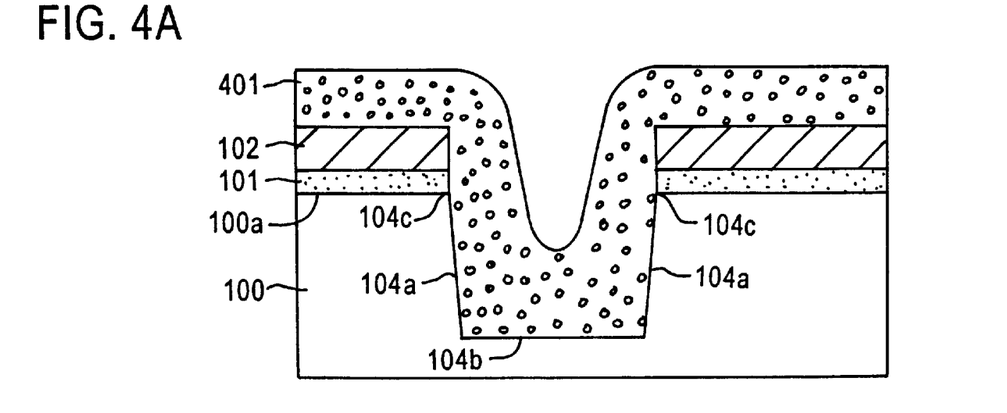
FIGS. 4A–4C schematically illustrate sequential phases of a method in accordance with a further embodiment of the present invention.
Figure 4B:
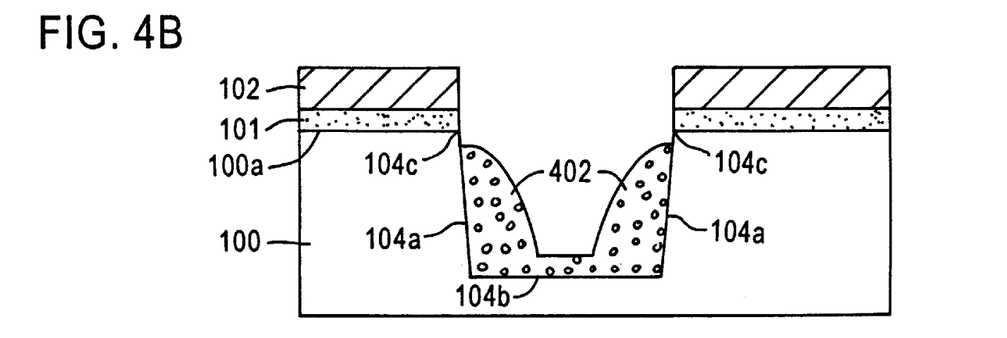
Figure 4C:
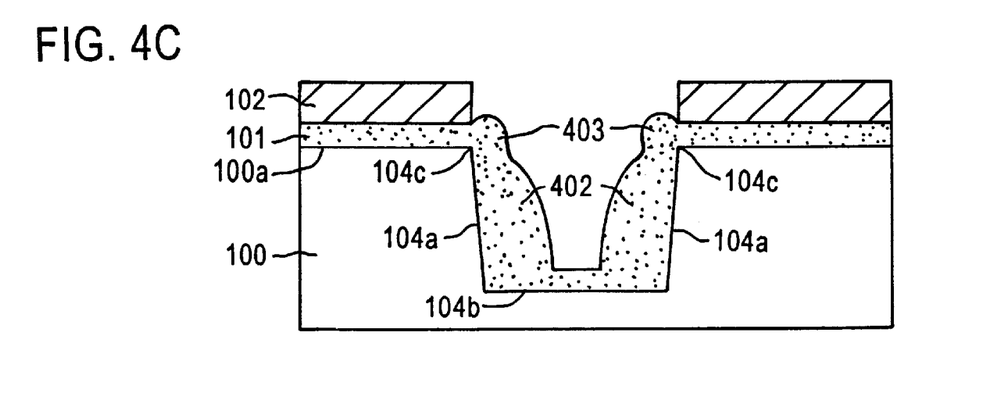

In still another embodiment of the present invention, as shown in FIGS. 4A–4C, a thin silicon oxynitride layer 401 is deposited after trench formation, as by CVD, to a thickness of about 20 Å to about 100 Å; i.e., about 50 Å (see FIG. 3A). Silicon oxynitride layer 401 is then anisotropically etched such that edges 104c are exposed (see FIG. 4B) and spacers 402 are formed. A thermal oxidation step is then performed as described above to oxidize silicon oxynitride spacer 402 and to round edges 104c by growing a rounded silicon dioxide layer 403 on edges 104a to a thickness of about 300 Å or greater (see FIG. 4C). Trench 104 is then refilled and planarized as previously described. The nitrogen in silicon oxynitride layer 401, which bonds with the silicon of sidewalls 104a to fix the silicon atoms, reduces the oxidation rate of sidewalls 104a, thereby avoiding reentrance of sidewalls 104a and transmission of stress to active areas adjacent to sidewalls 104a.

By the inventive method, spacers effectively increase the slope of the trench sidewalls, enabling the trench to be filled substantially without voids, which adversely affect the electrical characteristics of the finished device. Furthermore, by oxidizing the spacers after filling the trench, any voids in the insulating material are filled. Still further, if a trench liner or spacer material containing nitrogen is employed with the inventive methodology, nitrogen from the liner or spacer bonds with silicon atoms in the trench sidewalls, thereby reducing the oxidation rate of the sidewalls to prevent oxidation into the sidewalls during the spacer oxidation step, as well as preventing substantive stress formation in the source/drain regions of the substrate adjacent to the trench which could degrade the quality of a subsequently applied gate oxide layer.

The present invention is applicable to the manufacture of various types of semiconductor devices having STI, particularly high density semiconductor devices having a design rule of about 0.25 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a narrow trench in a semiconductor substrate, the trench having an internal surface and having edges at a main surface of the substrate;

depositing a spacer formation layer to cover the internal surface of the trench, the spacer formation layer including polysilicon or amorphous silicon;

anisotropically etching the spacer formation layer to form thin spacers on sidewalls of the internal surface of the trench;

depositing an insulating material to cover the main surface and to fill the trench substantially without creating voids; and planarizing the insulating material, the method further including heating, either before or after planarizing the insulating material, to completely oxidize the spacers.

2. A method of manufacturing a semiconductor device, which method comprises:

forming a narrow trench in a semiconductor substrate, the trench having an internal surface and having edges at a main surface of the substrate;

forming an oxide layer containing nitrogen on the internal surface of the trench;

depositing a spacer formation layer on the oxide layer formed on the internal surface of the trench;

anisotropically etching the spacer formation layer to form thin spacers on sidewalls of the internal surface of the trench; and depositing an insulating material to fill the trench substantially without creating voids, the method further including heating, before or after depositing the insulating material, to substantially completely oxidize the spacers.

3. A method of manufacturing a semiconductor device, which method comprises:

forming a narrow trench in a semiconductor substrate, the trench having an internal surface and having edges at a main surface of the substrate;

forming a silicon oxynitride layer on the internal surface of the trench;

anisotropically etching the silicon oxynitride layer to remove the silicon oxynitride layer from the trench edges;

forming a rounded oxide layer on the trench edges; and depositing an insulating material to fill the trench substantially without creating voids.

4. A method of manufacturing a semiconductor device, which method comprises:

forming a narrow trench in a semiconductor substrate, the trench having an internal surface and having edges at a main surface of the substrate;

depositing a spacer formation layer including silicon oxynitride to cover the internal surface of the trench;

anisotropically etching the spacer formation layer including silicon oxynitride to remove the spacer formation layer including silicon oxynitride from the trench edges;

forming a rounded oxide layer on the trench edges; and depositing an insulating material to fill the trench substantially without creating voids, wherein depositing a spacer formation layer including silicon oxynitride includes depositing a thin layer of silicon oxynitride and then depositing a layer of silicon on the thin layer of silicon oxynitride.

5. The method of claim 1, comprising depositing the spacer formation layer to a thickness of about 200 Å to about 300 Å.

6. The method of claim 2, comprising forming the oxide layer by rapid thermal annealing in an atmosphere of nitric oxide or ammonia.

7. The method of claim 2, comprising forming the oxide layer to a thickness of about 30 Å.

8. The method of claim 3, wherein forming a rounded oxide layer on the trench edges includes thermally growing a silicon dioxide layer to a thickness of about 300 Å or greater.

9. The method of claim 3, wherein the layer of silicon oxynitride is formed by CVD to a thickness of about 20 Å to about 100 Å.

10. The method of claim 4, wherein forming the rounded oxide layer on the trench edges includes thermally growing a silicon dioxide layer to a thickness of about 300 Å or greater.

11. The method of claim 4, wherein the thin layer of silicon oxynitride is deposited to a thickness of about 50 Å or less.

* * * * *